United States Patent
Carcasi

(10) Patent No.: US 8,474,468 B2
(45) Date of Patent: Jul. 2, 2013

(54) APPARATUS AND METHOD FOR THERMALLY PROCESSING A SUBSTRATE WITH A HEATED LIQUID

(75) Inventor: Michael A. Carcasi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 2131 days.

(21) Appl. No.: 11/537,622

(22) Filed: Sep. 30, 2006

(65) Prior Publication Data
US 2008/0081111 A1    Apr. 3, 2008

(51) Int. Cl.
*B08B 3/00*    (2006.01)
(52) U.S. Cl.
USPC ............................................. 134/135
(58) Field of Classification Search
USPC ................. 427/240; 134/117, 119, 121, 135
See application file for complete search history.

(56) References Cited

U.S. PATENT DOCUMENTS

| | | | |
|---|---|---|---|
| 5,158,616 A | 10/1992 | Kinoshita et al. | |
| 5,261,431 A | 11/1993 | Ueno et al. | |
| 5,339,539 A | 8/1994 | Shiraishi et al. | |
| 5,350,899 A | 9/1994 | Ishikawa et al. | |
| 5,361,787 A | 11/1994 | Miyazaki et al. | |
| 5,369,891 A | 12/1994 | Kamikawa | |
| 5,421,905 A | 6/1995 | Ueno et al. | |
| 5,435,075 A | 7/1995 | Shiraishi et al. | |
| 5,671,544 A | 9/1997 | Yokomizo et al. | |
| 5,782,990 A | 7/1998 | Murakami et al. | |
| 5,873,177 A | 2/1999 | Honda et al. | |
| 6,001,191 A | 12/1999 | Kamikawa et al. | |
| 6,112,595 A | 9/2000 | Stanke et al. | |
| 6,119,367 A | 9/2000 | Kamikawa et al. | |
| 6,203,627 B1 | 3/2001 | Shindo et al. | |
| 6,229,116 B1 | 5/2001 | Shirakawa et al. | |
| 6,241,827 B1 | 6/2001 | Tanaka et al. | |
| 6,345,909 B1 | 2/2002 | Yam | |
| 6,357,458 B2 | 3/2002 | Tanaka et al. | |
| 6,575,178 B1 | 6/2003 | Kamikawa | |
| 6,575,622 B2 | 6/2003 | Norrbakhsh et al. | |
| 6,597,964 B1 | 7/2003 | Huang et al. | |
| 6,637,445 B2 * | 10/2003 | Ogasawara et al. | 134/99.1 |
| 7,141,274 B2 * | 11/2006 | Wang et al. | 427/430.1 |
| 2004/0154641 A1 * | 8/2004 | Montierth | 134/3 |
| 2005/0199489 A1 | 9/2005 | Stevens et al. | |
| 2005/0218003 A1 | 10/2005 | Wang et al. | |
| 2005/0230260 A1 * | 10/2005 | Bleck et al. | 205/88 |
| 2008/0160462 A1 | 7/2008 | Herchen et al. | |

FOREIGN PATENT DOCUMENTS

| | | |
|---|---|---|
| JP | 04319723 A | 11/1992 |
| KR | 20070051646 A | 5/2007 |

OTHER PUBLICATIONS

USPTO, Office Action issued in related U.S. Appl. No. 11/833,038 dated as mailed Jul. 10, 2009.

* cited by examiner

*Primary Examiner* — Michael Barr
*Assistant Examiner* — David Cormier
(74) *Attorney, Agent, or Firm* — Wood, Herron & Evans, LLP

(57) ABSTRACT

Apparatus and method for heating a substrate in a bath containing a heated liquid inside a vessel of a thermal processing system. The liquid in the bath is heated and the substrate is brought into contact with the liquid in the bath. The substrate is heated to a process temperature by transferring heat energy from the heated liquid in the bath to the substrate. The substrate is removed from the heated liquid and dried before subsequent processing steps.

10 Claims, 7 Drawing Sheets

APPARATUS AND METHOD FOR THERMALLY PROCESSING A SUBSTRATE WITH A HEATED LIQUID

FIELD OF THE INVENTION

The invention is related to semiconductor processing, in particular, to apparatus and methods for thermally processing substrates.

BACKGROUND OF THE INVENTION

Photolithography processes for manufacturing semiconductor devices and liquid crystal displays (LCD's) generally coat a resist on a substrate, expose the resist coating to light to impart a latent image pattern, and develop the exposed resist coating to transform the latent image pattern into a final image pattern having masked and unmasked areas. Such a series of processing stages is typically carried out in a coating/developing system having discrete heating sections, such as a pre-baking unit and a post-baking unit. Each heating section of the coating/developing system incorporates a hotplate with a built-in heater of, for example, a resistance heating type.

Feature sizes of semiconductor device circuits have been scaled to less than 0.1 microns. Typically, the pattern wiring that interconnects individual device circuits is formed with sub-micron line widths. Consequently, the heat treatment temperature of the resist coating should be accurately controlled to provide reproducible and accurate feature sizes and line widths. The substrates or wafers (i.e., objects to be treated) are usually treated or processed under the same recipe (i.e., individual treatment program) in units (i.e., lots) each consisting of, for example, twenty-five wafers. Individual recipes define heat treatment conditions under which pre-baking and post-baking are performed. Wafers belonging to the same lot are heated under the same conditions.

According to each of the recipes, the heat treatment temperature may be varied within such an acceptable range that the temperature will not have an effect on the final semiconductor device. In other words, a desired temperature may differ from a heat treatment temperature in practice. When the wafer is treated with heat beyond the acceptable temperature range, a desired resist coating cannot be obtained. Therefore, to obtain the desired resist coating, a temperature sensor is used for detecting the temperature of the hotplate. On the basis of the detected temperature, the power supply to the heater may be controlled with reliance on feedback from the temperature sensor. However, because the temperature of the entire hotplate is not uniform and varies with the lapsed time, it is difficult to instantaneously determine the temperature of the hotplate by a single temperature sensor.

The pre-exposure bake process is a thermally activated, low temperature bake to which wafer is subjected after deposition of a resist. One goal of the pre-exposure bake process is to volatilize solvents in the resist and solidify the resist. Typically, pre-exposure bake processes are conducted using a hot plate in ambient air.

The post exposure bake process is a thermally activated process and, similar to pre-exposure bake processes, serves multiple purposes in photoresist processing. First, the elevated temperature of the bake drives the diffusion of the photoproducts in the resist. A small amount of diffusion may be useful in minimizing the effects of standing waves, which are the periodic variations in exposure dose throughout the depth of the resist coating that result from interference of incident and reflected radiation. Another main purpose of the post exposure bake process is to drive an acid-catalyzed reaction that alters polymer solubility in many chemically amplified resists. The post exposure bake process also plays a role in removing solvent from the wafer surface and strengthening the resist structure before etching.

Chemical amplification allows a single photoproduct to cause many solubility-switching reactions, thus increasing the sensitivity of these photoresist systems. Some amount of acid transport is necessary in that it allows a single acid to move to many reactive polymer sites. However, acid transport from nominally exposed to unexposed regions can complicate control of resist feature dimensions. Acid transport through these reactive systems is mechanistically complex. Measurements have shown that there is a very large difference in acid mobility between the starting material, which is reactive towards acid, and the product material, which is no longer reactive.

In addition to the intended results, numerous problems may be observed during heat treatment. For example, the light sensitive component of the resist may decompose at temperatures typically used to remove the solvent, which is a concern for a chemically amplified resist because the remaining solvent content has a strong impact on the diffusion and amplification rates. Also, heat-treating can affect the dissolution properties of the resist and, thus, have direct influence on the developed resist profile.

Hotplates having uniformities within a range of a few tenths of a degree centigrade are currently available and are generally adequate for current process methods. Hotplates are precisely calibrated using a flat bare silicon wafer with imbedded thermal sensors. However, actual production wafers carrying deposited films on the surface of the silicon may exhibit small amounts of warpage because of the stresses induced by the deposited films. This warpage may cause the normal gap between the wafer and the hotplate (referred to as the proximity gap), to vary across the wafer from a normal value of approximately 100 μm by as much as a 100 μm deviation from the mean proximity gap. Consequently, actual production wafers have different heating profiles than the wafer used to calibrate the hotplate.

This variability in the proximity gap changes the heat transfer characteristics in the area of the varying gap causing temperature non-uniformity on the wafer surface. This temperature difference may result in a change in critical dimension (CD) in that area of several nanometers, which can approach the entire CD variation budget for current leading edge devices, and will exceed the projected CD budget for smaller devices planned for production in the next few years.

What is needed, therefore, is a method and apparatus for heating a substrate during the pre- and post-exposure bake processes in a thermal processing system that is tolerant of warpage.

SUMMARY OF THE INVENTION

The invention provides an apparatus and method for heating a substrate in a liquid bath in a thermal processing system. In certain embodiments, a vessel is adapted to hold the liquid of the bath. A substrate support is configured to move the substrate between a first and second position where the substrate is contacting the liquid bath in the first position, and where the substrate is not contacting the liquid bath in the second position. The substrate support may be adapted to spin in order to dry the substrate after thermal processing.

The method for heating a substrate in a bath of a liquid in a thermal processing system comprises heating the liquid in the liquid bath. The substrate contacts the heated liquid in the bath. The substrate is heated to a process temperature by transferring heat energy from the heated liquid in the bath to the substrate. The substrate may removed from the heated liquid in the bath and dried.

In an embodiment of the invention, a method is provided for thermally processing a layer carried on a substrate with a liquid in a bath. The layer is resident on the substrate before thermal processing. The method comprises heating the liquid, contacting at least a portion of the substrate with the heated liquid in the bath, and transferring heat energy from the heated liquid in the bath to the substrate and the layer for heating the layer to a process temperature. The method further comprises thermally processing the layer at the process temperature for a time effective to change a property of the layer.

In an embodiment of the invention, a thermal processing apparatus is provided for heating a layer on a substrate in a bath of a heated liquid in a system. The thermal processing apparatus comprises a vessel including a base and a lid movable relative to the base between opened and closed positions. The vessel is adapted to be partially filled by the bath of the heated liquid so that a headspace is defined between the bath and the lid as an unfilled volume. The thermal processing apparatus further comprises a substrate support disposed in the vessel. The substrate support is moveable relative to the vessel for transporting the substrate between a first position in which the substrate contacts the heated liquid in the bath and a second position in which the substrate has a non-contacting relationship with the heated liquid in the bath. The thermal processing apparatus further comprises a compressed gas source communicating with the vessel. The compressed gas source is adapted to communicate compressed gas to the headspace for pressurizing the headspace to a pressure effective to elevate a boiling point of the liquid in the bath.

In another embodiment of the invention, a thermal processing apparatus is provided for heating a layer on a substrate in a bath of a heated liquid. The thermal processing apparatus comprises a vessel adapted to be partially filled by the bath of the heated liquid and a substrate support disposed in the vessel. The substrate support is configured to move relative to the vessel for transporting the substrate between a first position in which the substrate contacts the heated liquid in the bath and a second position in which the substrate has a non-contacting relationship with the heated liquid in the bath. The substrate support is further configured to rotate relative to the vessel when the substrate support is in the second position for removing residual liquid from the substrate.

In yet another embodiment of the invention, a thermal processing apparatus is provided for heating a layer on a substrate in a bath of a heated liquid in a system. The thermal processing apparatus comprises a vessel adapted to be partially filled by the bath of the heated liquid and a substrate support disposed in the vessel. The substrate support is configured to move relative to the vessel for transporting the substrate between a first position in which the substrate contacts the heated liquid in the bath and a second position in which the substrate has a non-contacting relationship with the heated liquid in the bath. The vessel is configured to rotate when the substrate support is in the second position for removing residual liquid from the substrate.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
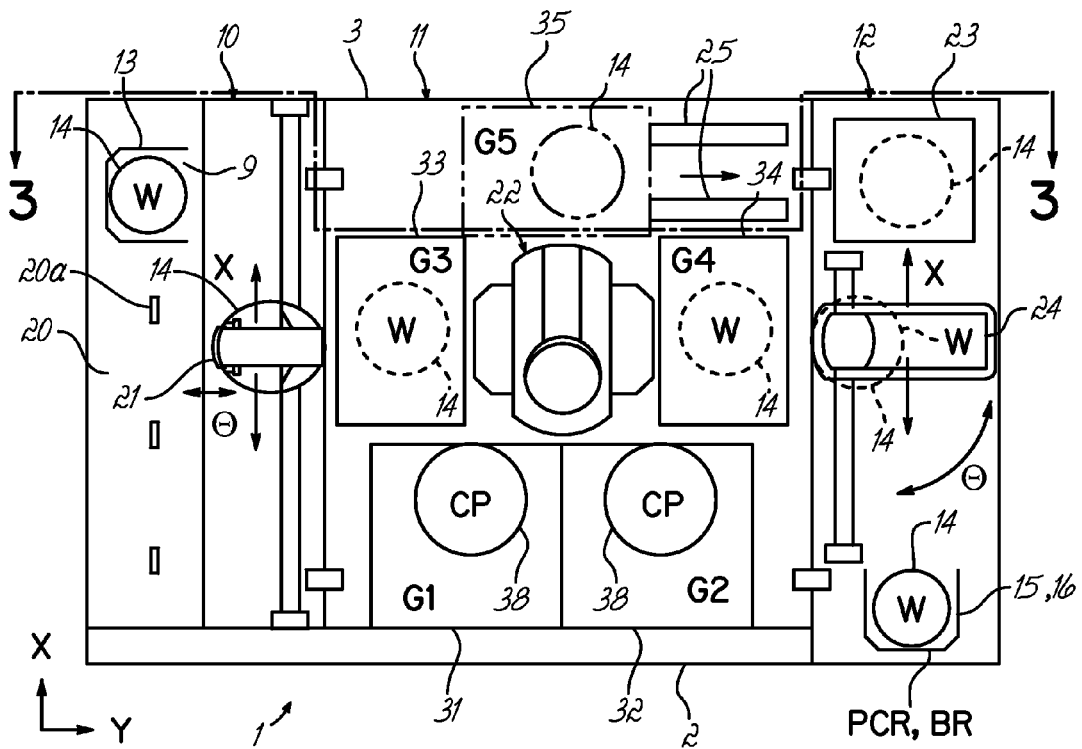
FIG. 1 is a top view of a schematic diagram of a coating/developing system for use in association with the invention.
Figure 2:
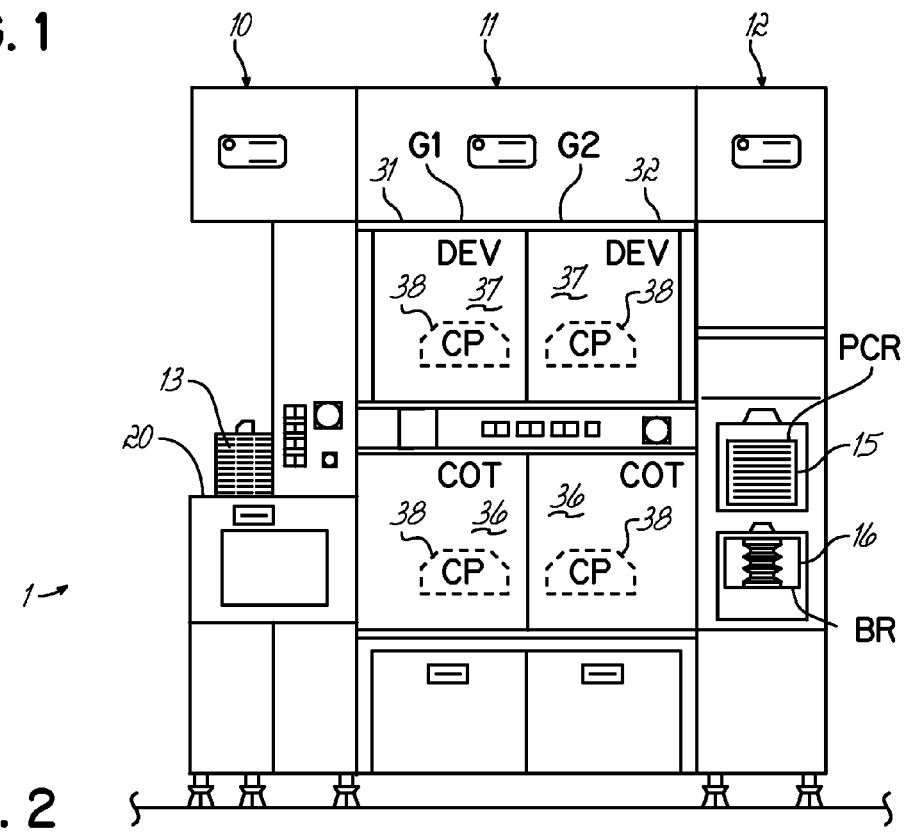
FIG. 2 is a front view of the coating/developing system of FIG. 1.
Figure 3:
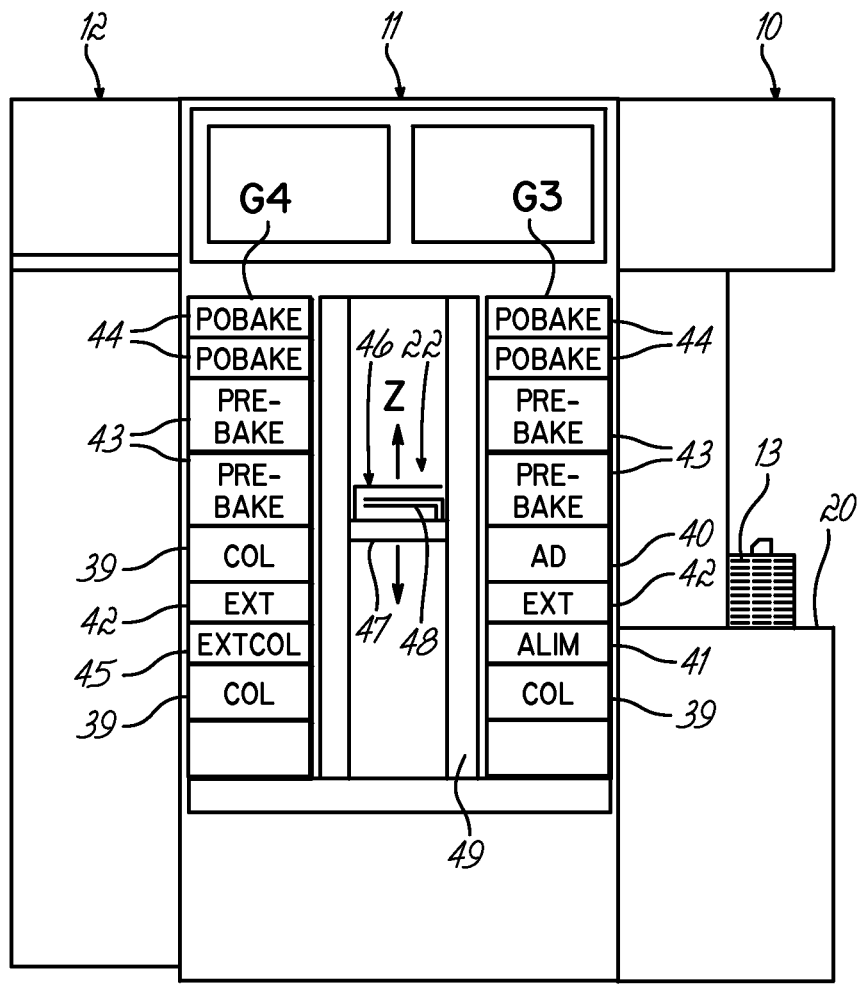
FIG. 3 is a partially cut-away back view of the coating/developing system of FIG. 1.

With reference to FIGS. 1-3, a coating/developing process system 1 comprises a cassette station 10, a process station 11, and an interface section 12, which are contiguously formed as one unit. In the cassette station 10, a cassette (CR) 13 storing a plurality of substrates represented by wafers (W) 14 (e.g., 25 wafers) is loaded into, and unloaded from, the system 1. The process station 11 includes various single-wafer processing units for applying a predetermined treatment required for a coating/developing step to individual wafers (W) 14. These process units are arranged in predetermined positions of multiple stages, for example, within first (G1), second (G2), third (G3), fourth (G4) and fifth (G5) multiple-stage process unit groups 31, 32, 33, 34, 35. The interface section 12 delivers the wafers (W) 14 between the process station 11 and an exposure unit (not shown) that can be abutted against the process station 11.

A cassette table 20 of cassette station 10 has positioning-projections 20a on which a plurality of wafer cassettes (CR) 13 (for example, at most 4) are mounted. The wafer cassettes (CR) 13 are thereby aligned in line in the direction of an X-axis (the up-and-down direction of FIG. 1) with a wafer inlet/outlet 9 facing the process station 11. The cassette station 10 includes a wafer transfer carrier 21 movable in the aligning direction (X-axis) of cassettes 13 and in the aligning direction (Z-axis, vertical direction) of wafers 14 stored in the wafer cassette (CR) 13. The wafer transfer carrier 21 gains access selectively to each of the wafer cassettes (CR) 13.

The wafer transfer carrier 21 is further designed rotatable in a Θ (theta) direction, so that it can gain access to an alignment unit (ALIM) 41 and an extension unit (EXT) 42 belonging to a third multiple-stage process unit group (G3) 33 in the process station 11, as described later.

The process station 11 includes a main wafer transfer mechanism 22 (movable up-and-down in the vertical direction) having a wafer transfer machine 46. All process units are arranged around the main transfer mechanism 22, as shown in FIG. 1. The process units may be arranged in the form of multiple stages G1, G2, G3, G4 and G5.

The main wafer transfer mechanism 22 has a wafer transfer machine 46 that is movable up and down in the vertical direction (Z-direction) within a hollow cylindrical supporter 49, as shown in FIG. 3. The hollow cylindrical supporter 49 is connected to a rotational shaft of a motor (not shown). The cylindrical supporter 49 can be rotated about the shaft synchronously with the wafer transfer machine 46 by the driving force of the motor rotation. Thus, the wafer transfer machine 46 is rotatable in the Θ direction. Note that the hollow cylindrical supporter 49 may be connected to another rotational axis (not shown), which is rotated by a motor.

The wafer transfer machine 46 has a plurality of holding members 48 which are movable back and forth on a table carrier 47. The wafer (W) 14 is delivered between the process units by the holding members 48.

In the process unit station 11 of this embodiment, five process unit groups G1, G2, G3, G4, and G5 can be sufficiently arranged. For example, first (G1) and second (G2) multiple-stage process unit groups 31, 32 are arranged in the front portion 2 (in the forehead in FIG. 1) of the system 1. A third multiple-stage process unit group (G3) 33 is abutted against the cassette station 10. A fourth multiple-stage process unit group (G4) is abutted against the interface section 12. A fifth multiple-stage process unit group (G5) can be optionally arranged in a back portion 3 of system 1.

As shown in FIG. 2, in the first process unit group (G1) 31, two spinner-type process units, for example, a resist coating unit (COT) 36 and a developing unit (DEV) 37, are stacked in the order mentioned from the bottom. The spinner-type process unit used herein refers to a process unit in which a predetermined treatment is applied to the wafer (W) 14 mounted on a spin chuck 52 (see FIG. 4) placed in a cup (CP) 38. Also, in the second process unit group (G2) 32, two spinner process units such as a resist coating unit (COT) 36 and a developing unit (DEV) 37, are stacked in the order mentioned from the bottom. It is preferable that the resist coating unit (COT) 36 be positioned in a lower stage from a structural point of view and to reduce maintenance time associated with the resist-solution discharge. However, if necessary, the coating unit (COT) 36 may be positioned in the upper stage.

As shown in FIG. 3, in the third process unit group (G3) 33, open-type process units, for example, a cooling unit (COL) 39 for applying a cooling treatment, an alignment unit (ALIM) 41 for performing alignment, an extension unit (EXT) 42, an adhesion unit (AD) 40 for applying an adhesion treatment to increase the deposition properties of the resist, two pre-baking units (PREBAKE) 43 for heating a wafer 14 before light-exposure, and two post-baking units (POBAKE) 44 for heating a wafer 14 after light exposure, are stacked in eight stages in the order mentioned from the bottom. The open type process unit used herein refers to a process unit in which a predetermined treatment is applied to a wafer 14 mounted on a support platform within one of the processing units. Similarly, in the fourth process unit group (G4) 34, open type process units, for example, a cooling unit (COL) 39, an extension/cooling unit (EXTCOL) 45, an extension unit (EXT) 42, another cooling unit (COL), two pre-baking units (PREBAKE) 43 and two post-baking units (POBAKE) 44 are stacked in eight stages in the order mentioned from the bottom.

Because the process units for low-temperature treatments, such as the cooling unit (COL) 39 and the extension/cooling unit (EXTCOL) 45, are arranged in the lower stages and the process units for higher-temperature treatments, such as the pre-baking units (PREBAKE) 43 and the post-baking units (POBAKE) 44 and the adhesion unit (AD) 40 are arranged in the upper stages in the aforementioned unit groups, thermal interference between units can be reduced. Alternatively, these process units may be arranged differently.

The interface section 12 has the same size as that of the process station 11 in the X direction but shorter in the width direction. A movable pickup cassette (PCR) 15 and an unmovable buffer cassette (BR) 16 are stacked in two stages in the front portion of the interface section 12, an optical edge bead remover 23 is arranged in the back portion, and a wafer carrier 24 is arranged in the center portion. The wafer transfer carrier 24 moves in the X- and Z-directions to gain access to both cassettes (PCR) 15 and (BR) 16 and the optical edge bead remover 23. The wafer carrier 24 is also designed rotatable in the Θ direction, so that it can gain access to the extension unit (EXT) 42 located in the fourth multiple-stage process unit group (G4) 34 in the process station 11 and to a wafer deliver stage (not shown) abutted against the exposure unit (not shown).

In the coating/developing process system 1, the fifth multiple-stage process unit group (G5, indicated by a broken line) 35 is designed to be optionally arranged in the back portion 3 at the backside of the main wafer mechanism 22, as described above. The fifth multiple-stage process unit group (G5) 35 is designed to be shifted sideward along a guide rail 25 as viewed from the main wafer transfer mechanism 22. Hence, when the fifth multiple-stage process unit group (G5) 35 is positioned as shown in FIG. 1, a sufficient space is obtained by sliding the fifth process unit group (G5) 35 along the guide rail 25. As a result, a maintenance operation to the main wafer transfer mechanism 22 can be easily carried out from the back side. To maintain the space for maintenance operation to the main wafer transfer mechanism 22, the fifth process unit group (G5) 35 may be not only slid linearly along the guide rail 25 but also shifted rotatably outward in the system.

The baking process performed by the adhesion unit (AD) 40 is not as sensitive to warpage of the wafer 14 as are the pre- and post-bake processes performed by the pre-baking units (PREBAKE) 43 and the post-baking units (POBAKE) 44. Therefore, the adhesion unit (AD) 40 may continue to utilize a hotplate in the heat treatment apparatus, as disclosed in U.S. Pat. No. 7,101,816 to Kaushal et al. ("Kaushal"), which is incorporated by reference herein in its entirety. Nevertheless, in embodiments of the invention, the adhesion unit (AD) 40 may also utilize any of the embodiments of the heat treatment apparatus described below.

Figure 4A:
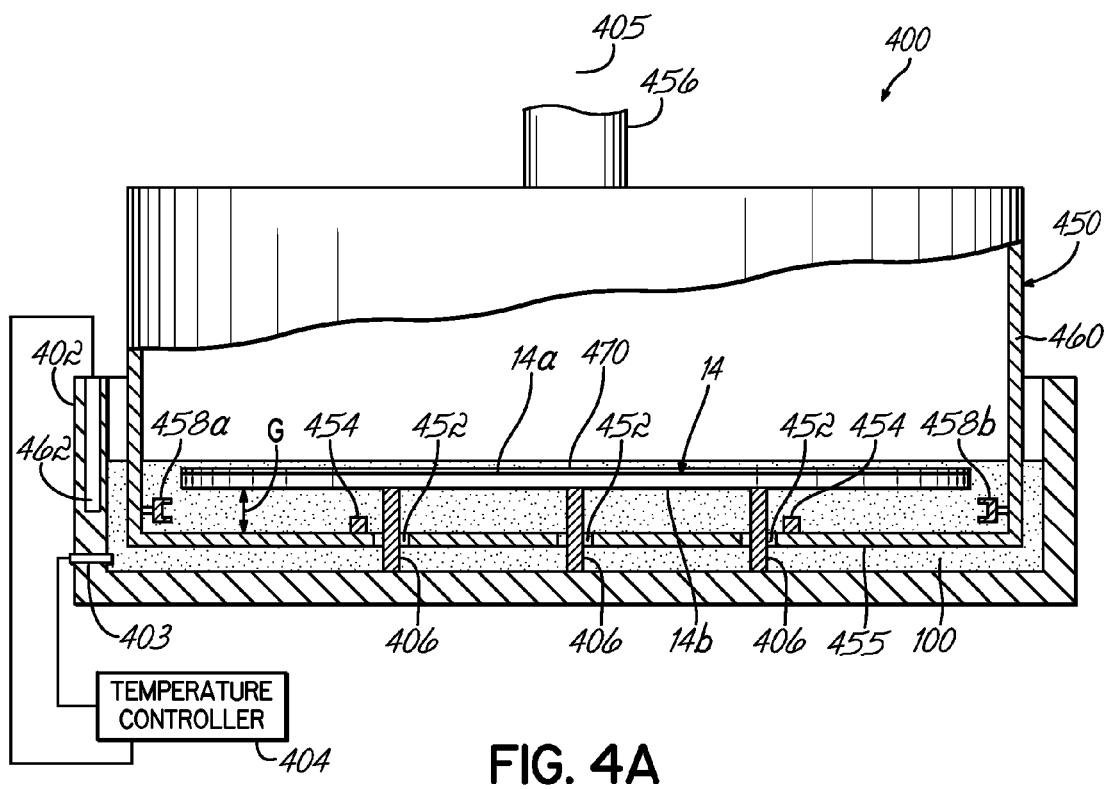
FIG. 4A is a side view of a heat treatment apparatus in accordance with an embodiment of the invention for use in the coating/developing system of FIG. 1.
Figure 4B:
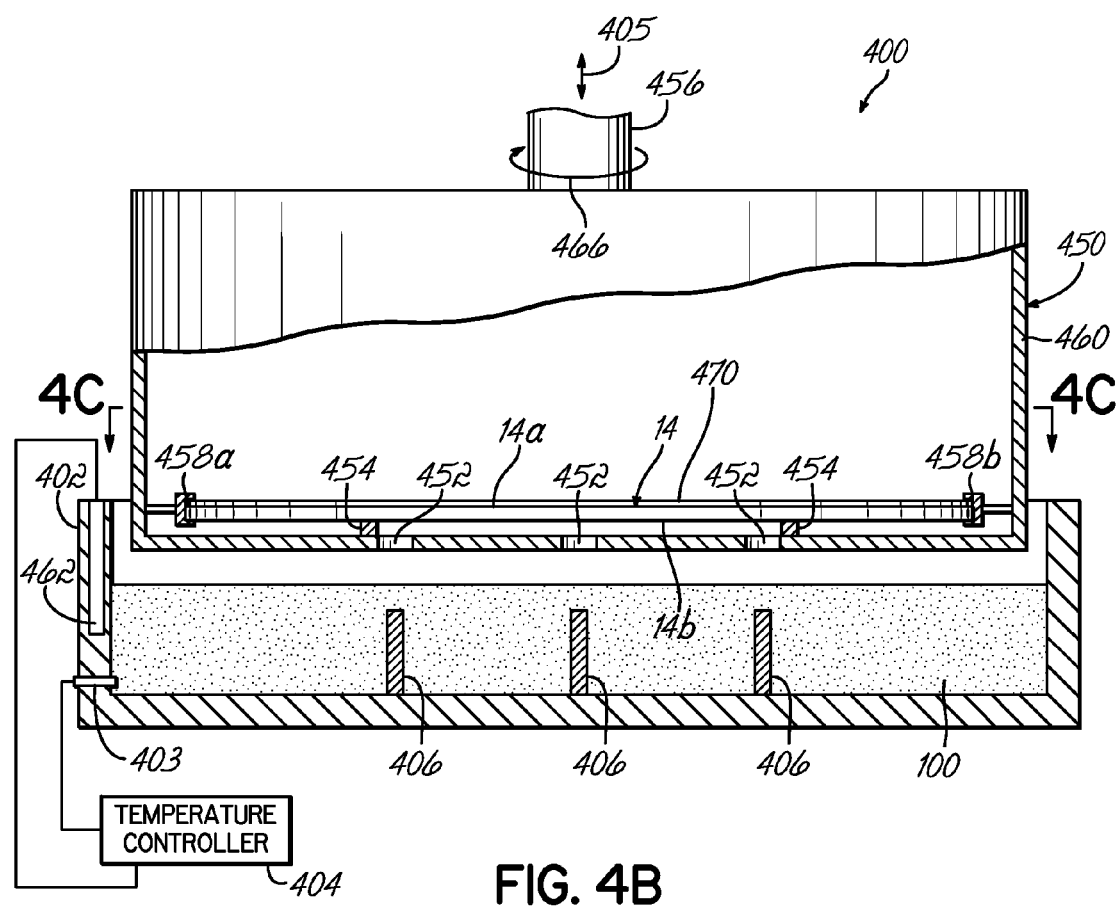
FIG. 4B is a side view similar to FIG. 4A in which the substrate has been removed from the liquid bath and is positioned for a drying process.
Figure 4C:
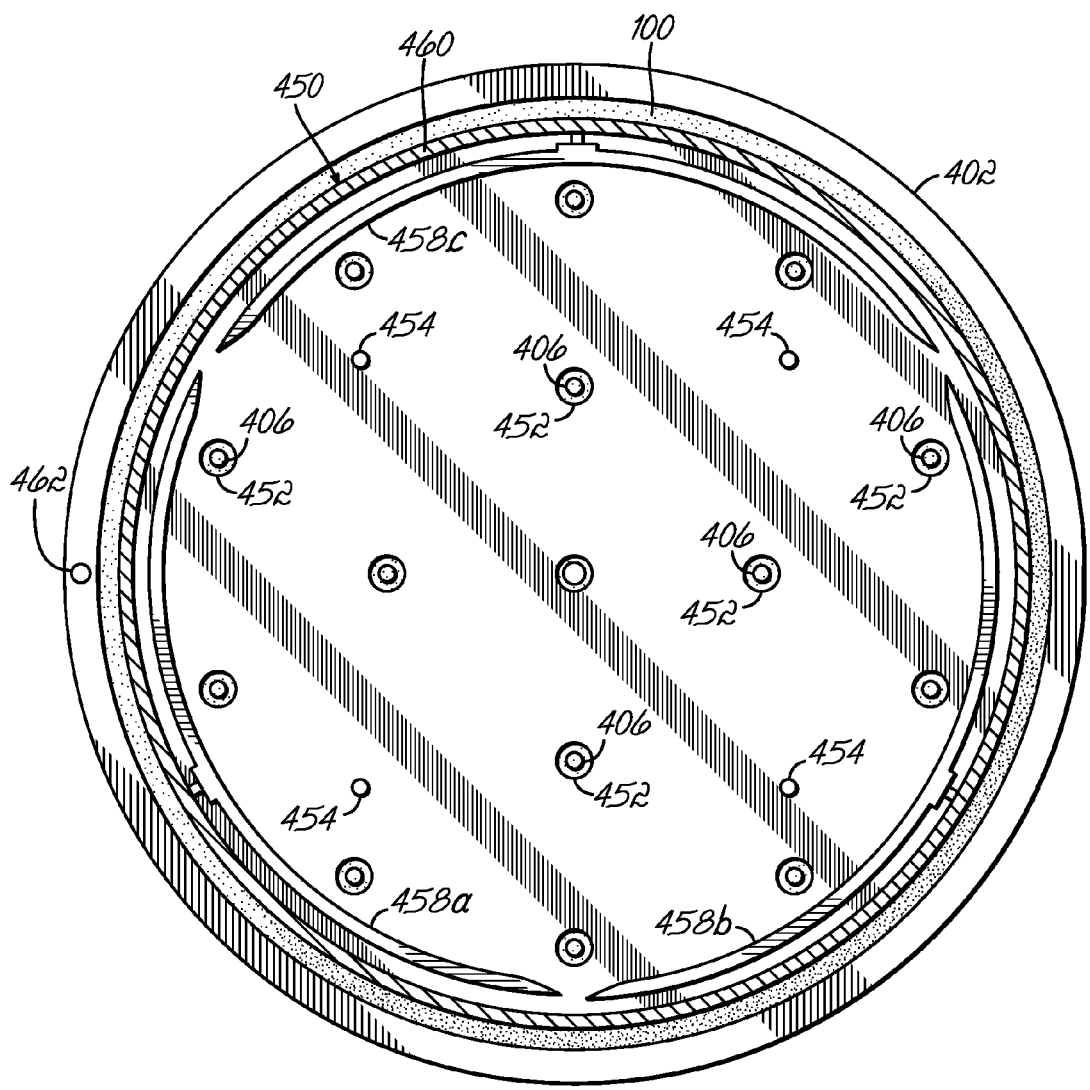
FIG. 4C is a top view of taken generally along line 4C-4C in FIG. 4B and with the wafer removed for purposes of description.

With reference to FIGS. 4A through 4C, a heat treatment apparatus 400 is shown in which wafers 14 are heated to a process (i.e., bake) temperature exceeding room temperature. The heat treatment apparatus 400 may be suitable for use as the pre-baking unit (PREBAKE) 43 of the thermal or coating/developing system 1 for performing pre-exposure baking processes and the post-baking unit (POBAKE) 44 of the thermal or coating/developing system 1 for performing post-exposure baking processes. The resist coating unit (COT) 36 is used to apply a resist layer 470 that is thermally processed by the heat treatment apparatus 400 at a suitable process temperature.

The heat treatment apparatus 400 includes a vessel 402, a liquid bath 100 confined in the vessel 402, and a basket 450 constructed to support the wafer 14. The vessel 402 includes one or more heating elements 462 thermally coupled with the vessel 402. The one or more heating elements 462 may comprise any conventional type of heating element as understood by a person having ordinary skill in the art. The one or more heating elements 462, when powered, generate heat energy for transfer to the vessel 402. The vessel 402, when heated to an elevated temperature by heat energy from the one or more heating elements 462, is operative to transfer heat energy to the liquid bath 100. The transferred heat energy heats the liquid bath 100. During a thermal treatment, the one or more heating elements 462 are configured to heat the liquid bath 100 to a temperature that is effective to maintain the wafers 14 at a process temperature for thermally processing the resist layer 470.

A temperature controller 404 is electrically coupled with the one or more heating elements 462. The temperature controller 404 is also electrically coupled with a thermal sensor 403. The thermal sensor 403 communicates with the liquid bath 100 for detecting a temperature of the liquid bath 100 and generating electrical signals relating to the detected temperature. The temperature controller 404 uses the electrical signals from the thermal sensor 403 as feedback to control the power supplied to the one or more heating elements 462. The thermal sensor 403 and temperature controller 404 have constructions and operating principles understood by a person having ordinary skill in the art.

Basket 450 is suspended from a shaft 456 that is bi-directionally movable, as indicated by double-headed arrow 405, relative to the stationary vessel 402 for lifting and lowering the wafer 14 into contact with the liquid bath 100 for thermal processing and out of contact with the liquid bath 100 for drying and wafer exchanges. The basket 450 has a lowered position (FIG. 4A) to which the shaft 456 lowers the basket 450 to contact or wet the wafer 14 with the liquid of the liquid bath 100 for thermally processing the resist layer 470. In the illustrated embodiment, the resist layer 470 carried on a top surface 14a of the wafer 14, as well as the backside 14b, are wetted by the liquid of the liquid bath 100. However, alternatively, the wafer 14 may be positioned such that the resist layer 470 has a non-contacting relationship with the liquid bath 100, which keeps the resist layer 470 dry. The basket 450 has a lifted position (FIG. 4B) in which the shaft 456 raises the basket 450 so that the wafer 14 has a non-contacting relationship with the liquid bath 100.

Posts 454 project from a bottom wall 455 of the basket 450. The posts 454 contact and support the wafer 14, such as when basket 450 is in the lifted position, so that the backside 14b of wafer 14 does not fully rest on the bottom wall 455 of the basket 450. Clamping devices 458a, 458b, 458c are stationed radially inwardly from a peripheral sidewall 460 of the basket 450 and have corresponding gripping heads oriented for grasping a peripheral rim of the wafer 14. The clamping devices 458a, 458b, 458c are adapted to move radially inward to grasp the peripheral rim of the wafer 14 and to move radially outward to release the peripheral rim of the wafer 14. The clamping devices 458a, 458b, 458c may have an air driven construction or any other suitable conventional construction understood by a person having ordinary skill in the art. The posts 454 cooperate with clamping devices 458a, 458b, 458c to support the wafer 14 when the basket 450 is in the raised position and being spun, as indicated by arrow 466, to remove residual liquid from the wafer 14 during a drying process, as described below. When the wafer 14 is disposed in the basket 450, the posts 454 contact and support the wafer 14 at a reproducible height from the bottom wall 455 of basket 450 as an aid in positioning the wafer 14 for grasping by the clamping devices 458a, 458b, 458c.

Drain holes 452 are defined in the bottom wall 455 of the basket 450. When the basket 450 is raised to the lifted position, residual liquid drains from the wafer 14 and basket 450 through the drain holes 452 and back into the liquid bath 100. Posts 406 project from the bottom of the vessel 402 and into the liquid bath 100. A number of the drain holes 452 are spatially registered with the posts 406 so that the posts 406 can protrude through these particular drain holes 452 when the basket 450 is in the lowered position.

Posts 406 are longer than posts 454 such that, when the basket 450 is lowered to the lowered position and contacted by the liquid bath 100, the wafer 14 is transferred from posts 454 to posts 406. During the thermal treatment, posts 406 contact and support the wafer 14 at a reproducible height from the bottom wall 455 of basket 450. The posts 406 create a gap (G) (FIG. 4A) between a backside 14b of the wafer 14 and the bottom wall 455 of vessel 402. Heat energy is transferred from the liquid bath 100 to the wafer 14 until the process temperature of the resist layer 470 carried on wafer 14 and the temperature of the wafer 14 are substantially equilibrated with the temperature of the liquid bath 100. As described above, the equilibrated temperature represents a process temperature for the thermal process to be performed on the resist layer 470. Regions of the liquid bath 100, such as regions near the heated walls of the vessel 402, may have a locally higher temperature than regions of the liquid bath 100 contacting the wafer 14 and resist layer 470. Ideally, the liquid bath 100, the wafer 14, and the resist layer 470 are all equilibrated at the process temperature.

After the wafer 14 is heated by the liquid bath 100 and the basket 450 is raised to the lifted position, the wafer 14 may be dried by allowing the liquid of the liquid bath 100 to drain from the basket through the drain holes 452. During a drying process, the clamping devices 458a, 458b, 458c extend radially inward to engage the peripheral rim of the wafer 14. With the wafer 14 held by the clamping devices 458a, 458b, 458c, the shaft 456 rotates the basket 450, as diagrammatically indicated by single-headed arrow 466 (FIG. 4B), at an angular velocity sufficient to drive excess liquid toward the peripheral edge of the wafer 14. The excess liquid is ejected from the top surface 14a of the wafer 14 at the peripheral edge of wafer 14. The dried wafer 14 is removed from the basket 450 for further processing in the thermal or coating/developing system 1 (FIGS. 1-3).

Figure 5A:
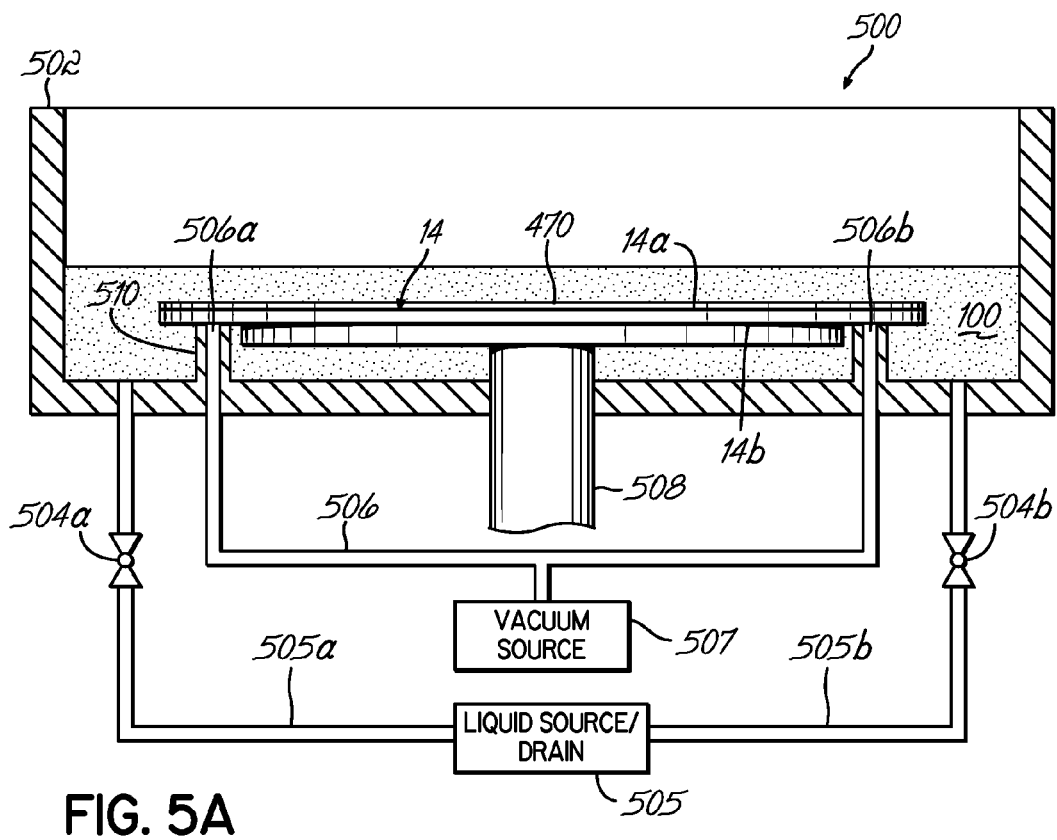
FIG. 5A is a side view of a heat treatment apparatus in accordance with an alternative embodiment of the invention for use in the coating/developing system of FIG. 1.
Figure 5B:
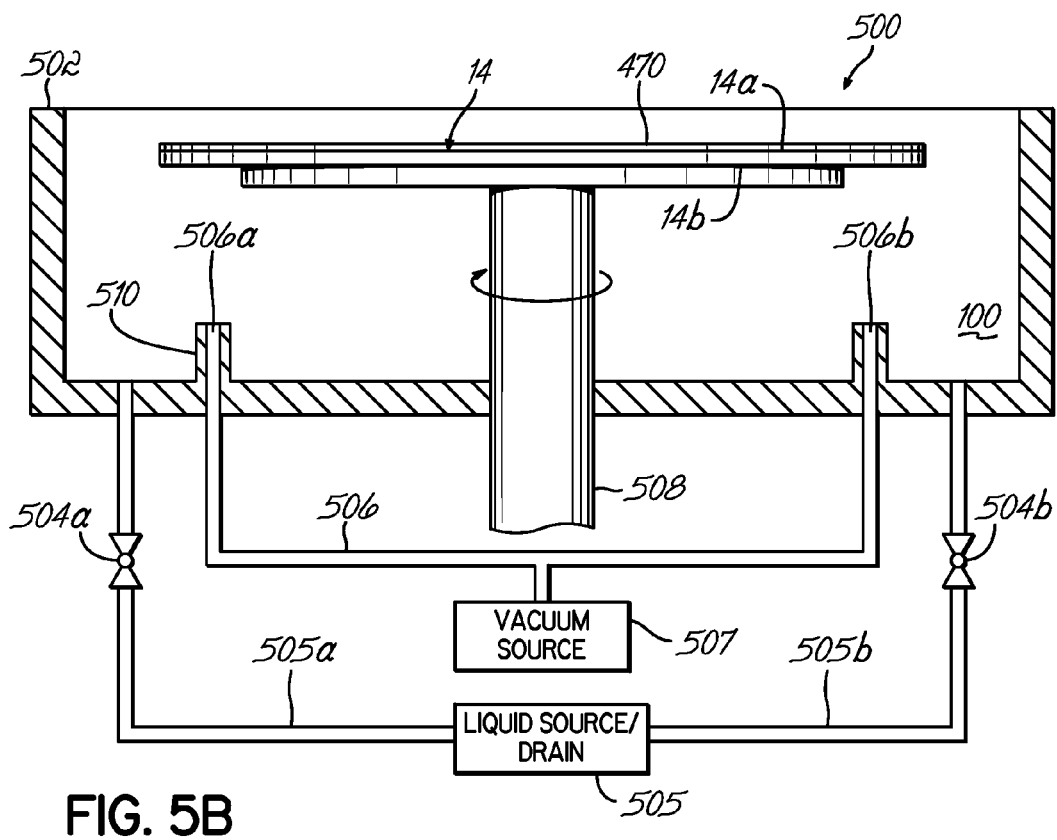
FIG. 5B is a side view similar to FIG. 5A in which the fluid bath has been drained from the vessel and the substrate is undergoing a drying process.

With reference to FIGS. 5A and 5B and in accordance with an embodiment of the invention, a thermal processing apparatus 500 utilizes a vessel 502 confining the liquid bath 100 and a spin chuck 508 configured to move a wafer 14 in and out of contact with the liquid bath 100. In particular, the spin chuck 508 has a lowered position (FIG. 5A) in which the spin chuck 508 lowers the wafer 14 into contact with the liquid of the liquid bath 100 for heat treating the resist layer 470 and a lifted position (FIG. 5B) in which the wafer 14 has a non-contacting relationship with the liquid bath 100. When the spin chuck 508 nears the lowered position, the wafer 14 is transferred from the spin chuck 508 to a support ring 510 that peripherally encircles the spin chuck 508. The wafer 14 is released from the spin chuck 508

The support ring 510 receives and supports the wafer 14 during thermal processing. Vacuum ports 506a, 506b, which are defined in the support ring 510, are coupled by a vacuum passageway 506 with a vacuum source 507. When the spin chuck 508 is in the lowered position and during the ensuing thermal processing treatment, suction applied from the vacuum source 507 to the vacuum ports 506a, 506b secures the wafer 14 to support ring 510.

The thermal processing apparatus 500 further comprises a liquid source/drain 505 that is configured to deliver the liquid of the liquid bath 100 to the vessel 502 via lines 505a, 505b and to drain the liquid from the vessel 502 through lines 505a, 505b. Liquid flow to and from the liquid source/drain 505 is regulated by valves 504a, 504b in lines 505a, 505b, respectively. The liquid source/drain 505 and lines 505a, 505b are constructed with conventional heating elements adapted to heat the liquid ultimately delivered to the vessel 502 to form the liquid bath 100.

As shown in FIG. 5B, the spin chuck 508 is also configured to dry the wafer 14 after thermal processing is complete. To that end, the spin chuck 508 is configured to rotate, when in the lifted position, about a rotational axis. If the angular velocity of the rotation is sufficient, any residual liquid on the wafer 14 is forced to the peripheral rim and ejected from wafer 14.

In use, the spin chuck 508 is initially in its lifted position. Wafer 14 is delivered to the thermal processing apparatus 500 and placed on the spin chuck 508. The spin chuck 508 lowers the wafer 14 into the vessel 502. As the spin chuck 508 reaches its lowered position, the wafer 14 is transferred from the spin chuck 508 to the support ring 510. The transferred wafer 14 is attracted to the support ring 510 by suction applied through vacuum ports 506a, 506b, which holds the wafer 14 in place during the thermal process. Once the wafer 14 is secured, valves 504a, 504b in lines 505a, 505b open to transfer heated liquid from the liquid source/drain 505 to fill the vessel 502, which creates the liquid bath 100. The level of the liquid bath 100 can be set to completely immerse the wafer 14 or be set to wet or contact only the backside 14b of wafer 14 without wetting the resist layer 470 on the top surface 14a. Heat energy is transferred from the liquid bath 100 to the wafer 14 and the resist layer 470 on the wafer for a duration and at a process temperature sufficient to thermally process the resist layer 470 to achieve a desired resulting property change of the resist in layer 470.

At the conclusion of the immersion baking process, valves 504a, 504b lines 505a, 505b open to drain the liquid of the liquid bath 100 from the vessel 502. The spin chuck 508 moves upward and establishes contact with the backside 14b of the wafer 14. Concurrently, the vacuum system 506 releases the suction applied to the wafer 14 through vacuum ports 506a, 506b. As the spin chuck 508 continues its upward movement, the wafer 14 is transferred from the support ring 510 to the spin chuck 508. Eventually, the spin chuck 508 returns to its lifted position.

In the lifted position, the spin chuck 508 rotates at an angular velocity sufficient to spin-dry the wafer 14. In an alternative embodiment, a solvent, such as isopropyl alcohol, may be applied simultaneously to the spinning wafer 14 during the drying process to promote a reduction in the occurrence of liquid droplets or watermarks on the wafer 14. In another alternative embodiment, a stream of nitrogen gas may be supplied along with the isopropyl alcohol to the spinning wafer 14. In yet another alternative embodiment, a stream of nitrogen gas may also be introduced to the backside 14b of the spinning wafer 14 to assist with the drying process. After drying concludes, the wafer 14 is removed from the thermal processing apparatus 500 for further processing in the thermal or coating/developing system 1 (FIGS. 1-3).

When selecting a particular liquid for the liquid bath 100, the boiling point of the candidate liquid or liquid composition should be greater than the process temperature for performing the thermal treatment. Generally, the process temperature is above room temperature but less than about 200° C. Process temperatures for the resist layer 470 on wafer 14 may be, for example, in the range of about 90° C. to about 130° C. Liquids characterized by relatively low boiling points, such as water, relative to the process temperature may be used in liquid bath 100 if the pressure of the vapor or gas in a headspace contacting the liquid is pressurized. To elevate the boiling point and as described below, the thermal processing apparatus may further comprise a pressure chamber.

Figure 6A:
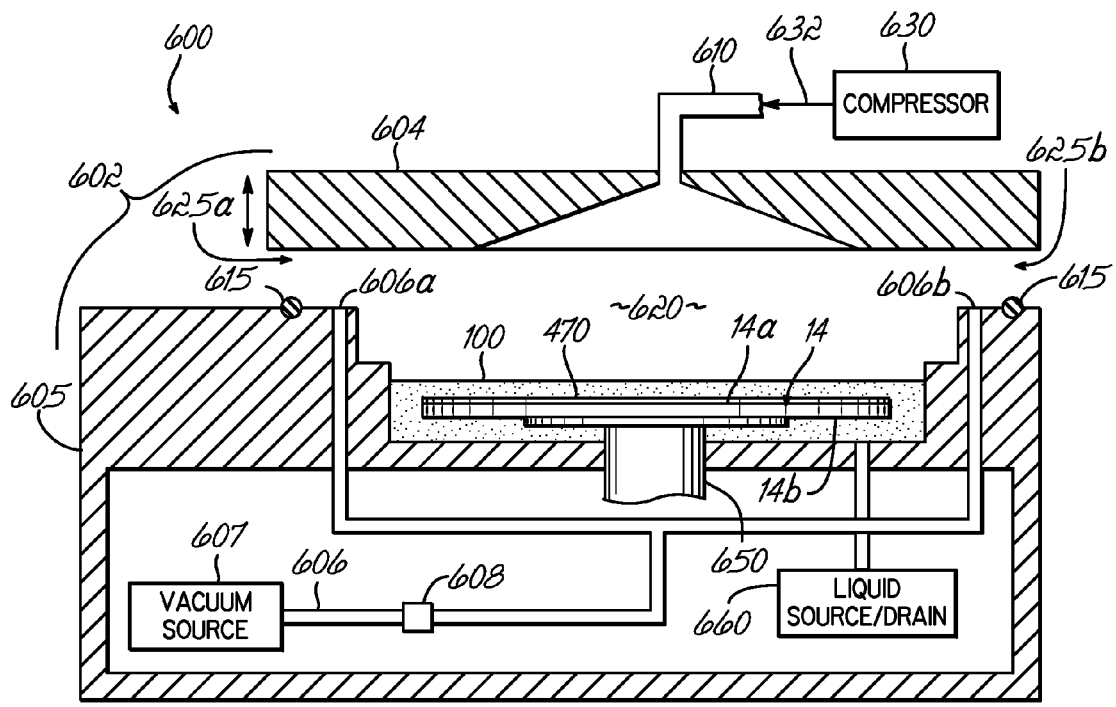
FIG. 6A is a side view of an embodiment of a heat treatment apparatus in accordance with an alternative embodiment of the invention for use in the coating/developing system of FIG. 1.
Figure 6B:
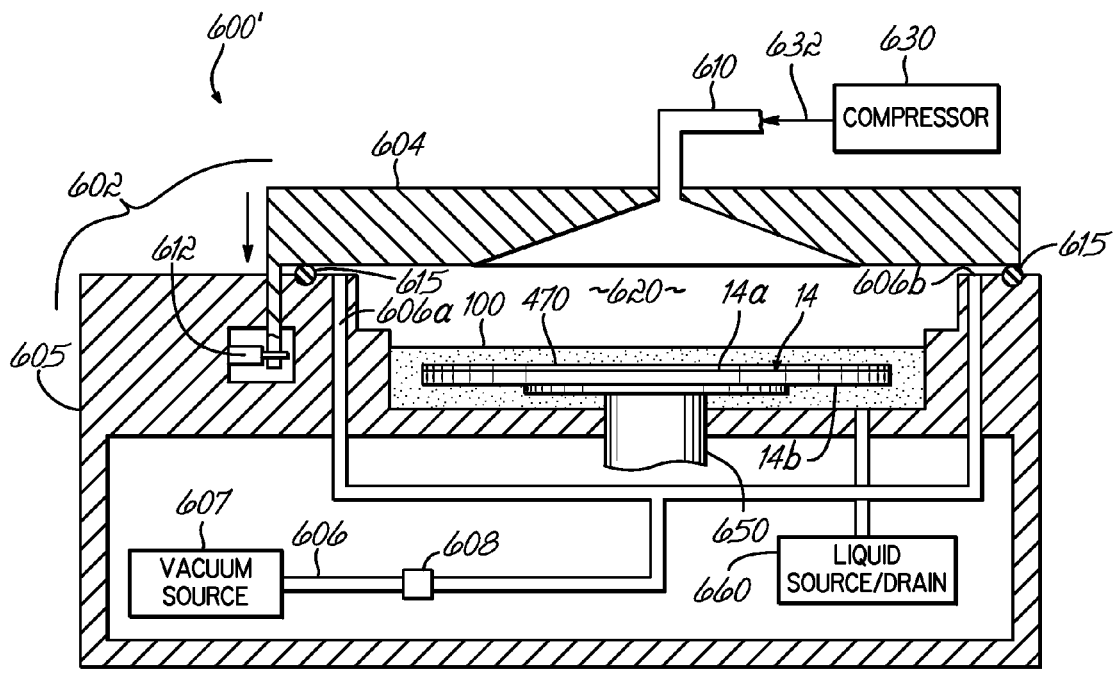
FIG. 6B is a side view similar to FIG. 6A showing an alternative embodiment of a heat treatment apparatus.

With reference to FIGS. 6A and 6B and in accordance with an embodiment of the invention, a thermal processing apparatus 600 includes a vessel 602 with a base 605 partially filled with the liquid bath 100 and a lid 604 movable relative to the base 605. The lid 604 has a contacting position (FIG. 6B) relative to the base 605 in which the lid 604 is sealed with the base 605 and a non-contacting position (FIG. 6A) relative to the base 605 in which the lid 604 is separated from the base 605 by gaps 625a, 625b. A liquid source/drain 660 is coupled with the vessel 602 for delivering the liquid of the liquid bath 100 to vessel 602 and draining the liquid of the liquid bath 100 from vessel 602. The liquid source/drain 660 may include one or more valves (not shown) for regulating the flow of the liquid to and from the vessel 602.

The base 605 includes vacuum ports 606a, 606b that are coupled by a vacuum line 606 with a vacuum source 607. A manometer 608 monitors the vacuum pressure in the vacuum line 606. When the lid 604 and base 605 are in the contacting position, suction is applied through the vacuum ports 606a, 606b that secures the lid 604 in contact with the base 605. A sealing member 615, such as an o-ring, is compressed between the lid 604 and base 605 to provide a substantially gas-tight seal.

A spin chuck 650, which is disposed inside the vessel 602, holds the wafer 14 during thermal processing. The spin chuck 650, which is similar to spin chuck 508 (FIG. 5), may be utilized to move the wafer 14 relative to the vessel 602 and liquid bath 100 and to dry the wafer 14 after thermal processing concludes. When the lid 604 and base 605 are in the non-contacting position, unprocessed wafers 14 may be received by the spin chuck 650 and processed wafers 14 may be removed from the spin chuck 650.

A headspace 620 is defined inside the vessel 602 as the portion of the volume unfilled by liquid bath 100. A compressed gas source, such as a compressor 630, is used to introduce pressurized gas, such as a pressurized inert gas, as diagrammatically indicated by single headed arrow number 632, into the headspace 620. The compressor 630 is operative to pressurize the gas and direct a flow of the pressurized gas to the headspace 620 through an inlet port 610 extending through the lid 604. When the headspace 620 about the liquid bath 100 is pressurized, the suction applied through the vacuum ports 606a, 606b maintains the lid 604 in the contacting position relative to the base 605. At sufficiently high pressures in the headspace 620, suction alone may be ineffective for maintaining the contacting relationship and seal between the lid 604 and base 605. In an alternative embodiment, a mechanical locking device 612, as shown in the thermal processing apparatus 600' in FIG. 6B, may be used in conjunction with the suction applied by the vacuum ports 606a, 606b to secure the lid 604 in the contacting position.

In use, wafer 14 is delivered to the vessel 602 of the thermal processing apparatus 600 through one of the gaps 625a, 625b between the lid 604 and base 605. The wafer 14 is positioned on the spin chuck 650 and lowered into vessel 602, which is unfilled by the liquid bath 100. The liquid of liquid bath 100 is introduced from the liquid source/drain 660 into the vessel 602, which wets the wafer 14. The lid 604 is lowered relative to the base 605 into a mutually contacting relationship and suction applied through the vacuum ports 606a, 606b moves the lid 604 toward the base 605 and compresses the sealing member 615. The manometer 608 monitors the vacuum pressure in vacuum line 606 during thermal processing to maintain the sealed engagement between the lid 604 and base 605.

Pressurized inert gas 632 is introduced from the compressor 630 through inlet 610 and fills the headspace 620. The incompressible liquid filling the liquid bath 100 displaces the compressible gas so that, when the vessel 602 is partially filled with liquid, the headspace 620 and liquid bath 100 are coextensive along an interface. Because of the pressurization, the boiling point of the liquid in the liquid bath 100 is elevated and, as a consequence, the liquid can be heated to a process temperature exceeding the atmospheric pressure boiling point of the liquid.

Wafer 14 is processed in the liquid bath 100 at the process temperature for a duration sufficient to heat treat the resist layer 470. At the conclusion of the thermal treatment, the liquid bath 100 is drained, the headspace 620 is vented to atmospheric pressure, and the suction is removed from the vacuum ports 606a, 606b to release the lid 604. The lid 604 of the vessel 602 is lifted to the non-contacting position relative to the base 605. The spin chuck 650 is raised such that the wafer 14 has a non-contacting relationship with the liquid bath 100 and then spin dries the wafer 14 to remove residual liquid. The spin chuck 650 is then raised to an elevation relative to the base 605 sufficient to access the wafer 14 for removal. The wafer 14 is removed from the thermal processing apparatus 600 through one of the gaps 625a, 625b for further processing in the thermal or coating/developing system 1 (FIGS. 1-3).

Figure 7A:
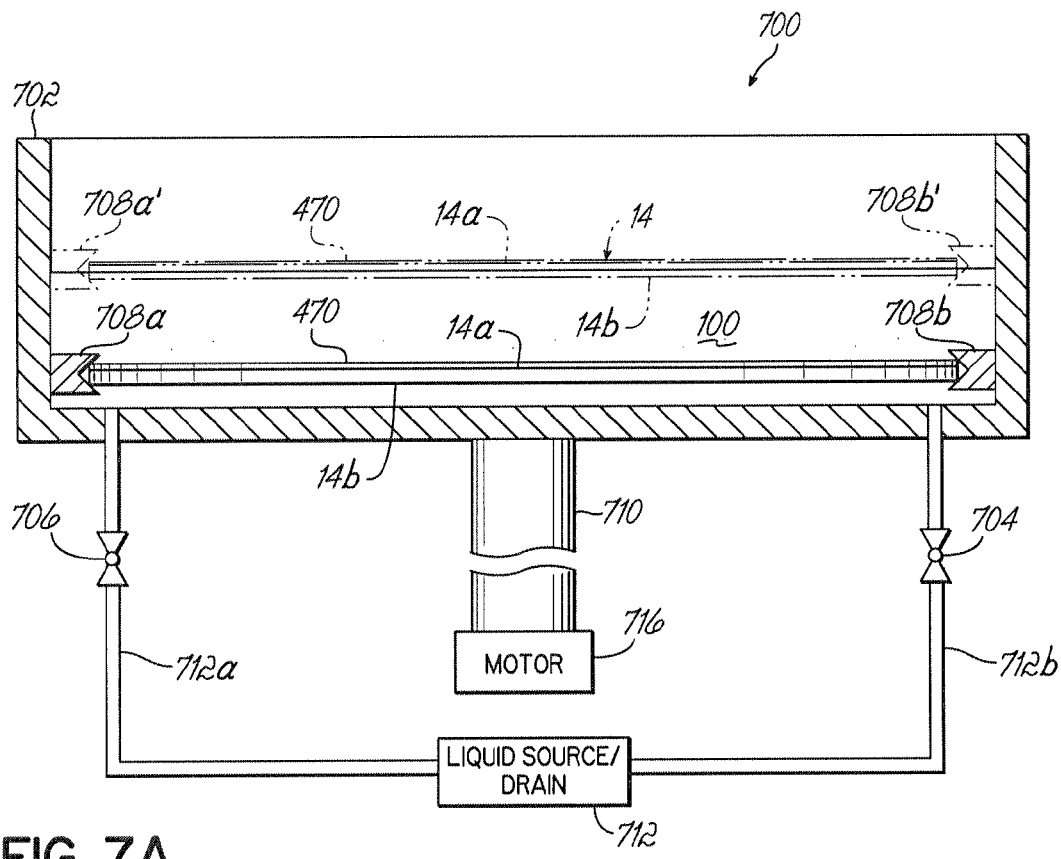
FIG. 7A is a side view of an embodiment of a heat treatment apparatus in accordance with an alternative embodiment of the invention for use in the coating/developing system of FIG. 1.
Figure 7B:
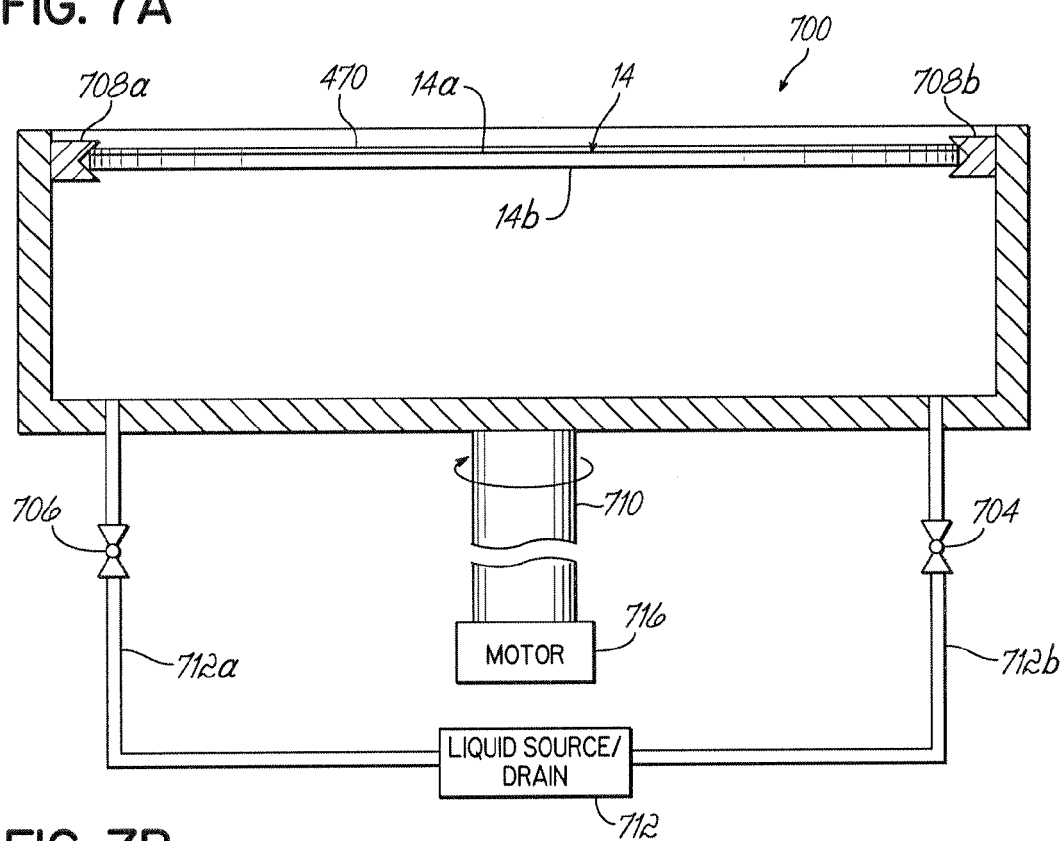
FIG. 7B is a side view similar to FIG. 7A in which the fluid bath has been drained and the substrate is undergoing a drying process.

With reference to FIGS. 7A and 7B and in accordance with an embodiment of the invention, a thermal processing apparatus 700 includes a vessel 702 and peripheral grips 708a, 708b that are configured to support wafer 14 inside the vessel 702. The grips 708a, 708b are configured to move relative to the vessel 702 between a lowered position (FIG. 7A) in which the wafer 14 is wetted by the liquid of the liquid bath 100 and a raised position (FIG. 7B) in which the wafer 14 has a non-contacting relationship with the liquid bath 100. A liquid source/drain 712 is coupled with the vessel 702 for delivering the liquid of the liquid bath 100 to vessel 702 and draining the liquid of the liquid bath 100 from vessel 702 via lines 712a, 712b. Valves 704, 706 in lines 712a, 712b, respectively, regulate the flow of liquid to and from the vessel 702. The liquid source/drain 712 is operative to heat the liquid, before the liquid is delivered to the vessel 702, so that the liquid bath 100 includes heated liquid.

A motor 716 is coupled by a shaft 710 and a drive mechanism (not shown) with the vessel 702. The motor 716 is operated to spin the vessel 702, after the liquid of the liquid bath 100 is drained to the liquid source/drain 712 and while the grips 708a, 708b secure the wafer 14, to force residual liquid toward the peripheral edge of wafer 14 by centrifugal forces and eject the residual liquid from the peripheral edge to dry the wafer 14 after the thermal treatment.

In use, wafer 14 is delivered to thermal processing apparatus 700 and secured by grips 708a, 708b. The grips 708a, 708b are moved relative to the vessel 702. The grips 708a, 708b may lower the wafer 14 to either a partially immersed position (as shown in dot-dashed lines in FIG. 7A) in which the backside 14b of the wafer 14 will be contacted by the liquid bath 100 or to a fully immersed position in which the resist layer 470 on the top surface 14a of wafer 14 and the backside 14b of the wafer 14 are wetted by the liquid bath 100. Heated liquid is introduced from the liquid source/drain 712 into the vessel 702 to partially fill the vessel 702 to form the liquid bath 100. The resist layer 470 is thermally processed for a duration and at a process temperature sufficient to change a property of the resist layer 470. When the thermal treatment is complete, the grips 708a, 708b move relative to the vessel 702 to remove the wafer 14 from the liquid bath 100. The liquid is drained to liquid source/drain 712 and the wafer 14 is dried by spinning the vessel 702. The dried wafer 14 is removed from the thermal processing apparatus 700 for further processing in the thermal or coating/developing system 1 (FIGS. 1-3).

In addition to the spin dry methodology disclosed in certain embodiments, the drying process in other embodiments may employ alternate methods as will be apparent to those skilled in the art. For example, an air knife operative to impinge the wafer 14 with a high velocity flow of gas or a chemical displacement process with a high volatility solvent with a high evaporation rate may be used to dry the wafer 14.

For any of the described embodiments of the invention, the liquid in the liquid bath 100 may be heated by actively heating the vessel and transferring heat energy from the vessel to the liquid in the liquid bath, as described with regard to vessel 502 (FIG. 5), or may be heated externally to the vessel and transferred to the vessel in a heated condition, as described with regard to thermal processing apparatus 700 (FIG. 7).

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicants' general inventive concept.

What is claimed is:

1. A thermal processing apparatus for heating a layer on a substrate in a bath of a heated liquid, the thermal processing apparatus comprising:

a vessel including a base and a lid movable relative to said base between opened and closed positions, said vessel adapted to be partially filled by the bath of the heated liquid so that a headspace is defined between the bath and said lid as an unfilled volume;

a substrate support in said vessel, said substrate support moveable relative to said vessel for transporting the substrate between a first position in which the substrate contacts the heated liquid in the bath and a second position in which the substrate has a non-contacting relationship with the heated liquid in the bath; and a compressed gas source communicating with said vessel, said compressed gas source adapted to communicate compressed gas to the headspace for pressurizing the headspace to a pressure effective to elevate a boiling point of the liquid in the bath, wherein a backside of the substrate contacts the heated liquid in the bath and the layer on the substrate does not contact the liquid when the substrate is in the first position.

2. The thermal processing apparatus of claim 1 wherein said substrate support is adapted to rotate relative to said vessel when said substrate support is in said second position for drying the substrate and the layer.

3. The thermal processing apparatus of claim 1 wherein said vessel is adapted to rotate when said substrate support is in said second position for drying the substrate and the layer.

4. A thermal processing apparatus for heating a layer on a substrate in a bath of a heated liquid in a system, the thermal processing apparatus comprising:
- a vessel adapted to be partially filled by the bath of the heated liquid; and
- a substrate support in said vessel, said substrate support configured to move relative to said vessel for transporting the substrate between a first position in which the substrate contacts the heated liquid in the bath and a second position in which the substrate has a non-contacting relationship with the heated liquid in the bath, and said substrate support configured to rotate relative to said vessel when said substrate support is in said second position for removing residual liquid from said substrate,
- wherein a backside of the substrate contacts the heated liquid in the bath and the layer on the substrate does not contact the liquid when the substrate is in the first position.

5. The thermal processing apparatus of claim 4 further comprising:
- a liquid source communicating with said vessel, said liquid source configured to heat the liquid and transfer the heated liquid to said vessel.

6. The thermal processing apparatus of claim 4 further comprising:
- a heating element thermally coupled with said vessel, said heating element configured to transfer heat energy to said vessel for heating the heated liquid;
- a thermal sensor communicating with the heated liquid in the bath in said vessel, said thermal sensor detecting a temperature of the heated liquid and generating electrical signals relating to the temperature; and
- a temperature controller electrically coupled with said heating element and with said thermal sensor, said temperature controller operative to supply power to said heating element to generate the heat energy and to regulate the power based upon said electrical signals from said thermal sensor.

7. The thermal processing apparatus of claim 4 wherein said substrate support further comprises a spin chuck.

8. A thermal processing apparatus for heating a layer on a substrate in a bath of a heated liquid in a system, the thermal processing apparatus comprising:
- a vessel adapted to be partially filled by the bath of the heated liquid; and
- a substrate support in said vessel, said substrate support configured to move relative to said vessel for transporting the substrate between a first position in which the substrate contacts the heated liquid in the bath and a second position in which the substrate has a non-contacting relationship with the heated liquid in the bath,
- wherein said vessel is configured to rotate when said substrate support is in said second position for removing residual liquid from said substrate,
- wherein a backside of the substrate contacts the heated liquid in the bath and the layer on the substrate does not contact the liquid when the substrate is in the first position.

9. The thermal processing apparatus of claim 8 further comprising:
- a liquid source communicating with said vessel, said liquid source configured to heat the liquid and transfer the heated liquid to said vessel.

10. The thermal processing apparatus of claim 8 further comprising:
- a heating element thermally coupled with said vessel, said heating element configured to transfer heat energy to said vessel for heating the heated liquid;
- a thermal sensor communicating with the heated liquid in the bath in said vessel, said thermal sensor detecting a temperature of the heated liquid and generating electrical signals relating to the temperature; and
- a temperature controller electrically coupled with said heating element and with said thermal sensor, said temperature controller operative to supply power to said heating element to generate the heat energy and to regulate the power based upon said electrical signals from said thermal sensor.

* * * * *